(12) United States Patent
Furihata et al.

(10) Patent No.: US 7,474,175 B2
(45) Date of Patent: Jan. 6, 2009

(54) SURFACE ACOUSTIC WAVE DEVICE

(75) Inventors: Tetsuya Furihata, Osaka (JP); Takashi Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 290 days.

(21) Appl. No.: 10/594,333

(22) PCT Filed: Feb. 27, 2006

(86) PCT No.: PCT/JP2006/303570

§ 371 (c)(1),
(2), (4) Date: Sep. 27, 2006

(87) PCT Pub. No.: WO2006/093078

PCT Pub. Date: Aug. 9, 2006

(65) Prior Publication Data

US 2008/0272858 A1   Nov. 6, 2008

(30) Foreign Application Priority Data

Mar. 3, 2005   (JP) .............................. 2005-058549

(51) Int. Cl.
*H03H 9/10* (2006.01)
*H03H 9/25* (2006.01)
*H03H 9/64* (2006.01)

(52) U.S. Cl. .................... 333/193; 310/313 R; 310/340

(58) Field of Classification Search ................ 333/193; 310/313 R, 340

See application file for complete search history.

(56) References Cited

U.S. PATENT DOCUMENTS

| | | | | |
|---|---|---|---|---|
| 6,262,513 B1 * | 7/2001 | Furukawa et al. | ....... | 310/313 R |
| 6,417,026 B2 * | 7/2002 | Gotoh et al. | ................ | 438/108 |
| 6,663,943 B2 * | 12/2003 | Kadota | ........................ | 428/156 |
| 6,914,367 B2 * | 7/2005 | Furukawa | ................... | 310/340 |
| 6,928,719 B2 * | 8/2005 | Kim et al. | ..................... | 29/594 |
| 2004/0113215 A1 | 6/2004 | Shimada et al. | | |
| 2004/0213973 A1 * | 10/2004 | Hara et al. | ................... | 428/212 |

FOREIGN PATENT DOCUMENTS

| | | | |
|---|---|---|---|
| EP | 1 492 231 A1 | 12/2004 | |
| JP | 4-68002 A | 3/1992 | |

(Continued)

OTHER PUBLICATIONS

C.P. Wong et al.; "Understanding the Use of Silicone Gels for Non-Hermetic Plastic Packaging"; Proceedings of the 39th Electronic Components Conference, Houston, TX, May 22-24, 1989, pp. 769-776.*

(Continued)

*Primary Examiner*—Barbara Summons
(74) *Attorney, Agent, or Firm*—RatnerPrestia

(57) ABSTRACT

A surface acoustic wave device having a three-layered structure of sealing resin for sealing a mounting substrate and a surface acoustic wave element in which the elastic modulus of resin of the intermediate layer is higher than that of resin of the outermost layer and the elastic modulus of resin of the innermost layer is lower than that of resin of the outermost layer. The three-layered structure of the sealing resin suppresses crush of a bump when a pressure is applied from the outside and reduces stress applied to the bump due to the change in temperature.

16 Claims, 2 Drawing Sheets

FOREIGN PATENT DOCUMENTS

| | | |
|---|---|---|
| JP | 7-235626 A | 9/1995 |
| JP | 8-204497 A | 8/1996 |
| JP | 10-163605 A | 6/1998 |
| JP | 2001-110898 A | 4/2001 |
| JP | 2002-299523 A | 10/2002 |
| JP | 2003-174345 A | 6/2003 |
| JP | 2004-327623 A | 11/2004 |

OTHER PUBLICATIONS

Japanese language International Search Report for PCT/JP2006/303570, dated May 16, 2006.

Supplementary European Search Report for PCT/JP2006303570 dated Oct. 17, 2007.

* cited by examiner ated application PCT/JP2006/303570.

SURFACE ACOUSTIC WAVE DEVICE

This Application is a U.S. National Phase Application of PCT International Application PCT/JP2006/303570.

TECHNICAL FIELD

The present invention particularly relates to a surface acoustic wave device that is strong against the change in a pressure applied from the outside and an internal pressure and that is excellent in reliability under temperature cycling and the like.

BACKGROUND ART

Conventionally, this kind of surface acoustic wave device realized the reduction in size and height by forming a solder bump on the upper surface of an alumina mounting substrate, coupling a surface acoustic wave element to the mounting substrate via the solder bump with a surface for propagating a surface wave facing downward, and then coating the periphery of the surface acoustic wave element with a sealing resin layer.

A conventional surface acoustic wave device described in, for example, Japanese Patent Unexamined Publication No. H8-204497 includes sealing resin 1, mounting substrate 2, solder bump 3, and surface acoustic wave element 4 as shown in FIG. 3A.

However, in a conventional configuration, bump 3 used for coupling surface acoustic wave element 4 and mounting substrate 2 is formed of only a solder material. An exterior is also formed of only a resin layer. Therefore, when a strong pressure is applied from the outside, bumps are largely crushed as shown in FIG. 3B, which may lead to problems in electrical characteristics, for example, an open-circuit fault, a short-circuit fault, and the like.

SUMMARY OF THE INVENTION

A surface acoustic wave device of the present invention has three-layered structure of sealing resins in which the elastic modulus of resin of the intermediate layer is higher than that of resin of the outermost layer and the elastic modulus of resin of the innermost layer is lower than that of resin of the outermost layer.

This configuration suppresses crushing of a bump when a strong pressure is applied from the outside, making it possible to avoid problems in electrical characteristics, for example, an open-circuit fault, a short-circuit fault, and providing a high reliability under temperature cycling and the like.

Figure 1:
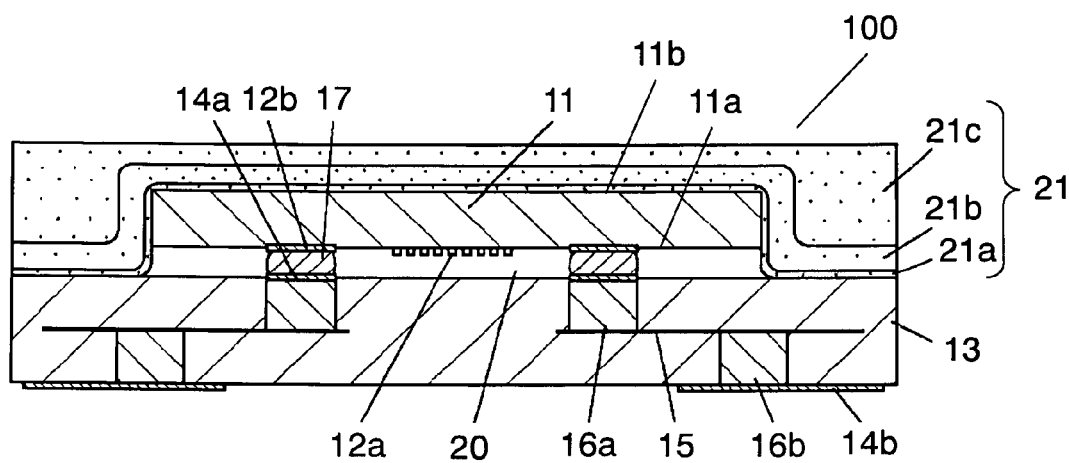
FIG. 1 is a sectional view showing a surface acoustic wave device in accordance with a first exemplary embodiment of the present invention.

REFERENCE MARKS IN THE DRAWINGS 11 surface acoustic wave element
12a interdigital transducer
12b pad electrode
13 mounting substrate
14a, 14b pad electrode
15 rewiring layer
16a, 16b via electrode
17 bump
20 gap
21 sealing resin
21a first resin
21b second resin
21c third resin
100 surface acoustic wave device

DETAILED DESCRIPTION OF THE PREFERRED EMBODIMENTS

First Exemplary Embodiment

Hereinafter, with a first exemplary embodiment, a surface acoustic wave device of the present invention is described with reference to drawings.

FIG. 1 is a sectional view showing a surface acoustic wave device in accordance with a first exemplary embodiment of the present invention.

As shown in FIG. 1, in surface acoustic wave device 100 of the present invention, mounting substrate 13 is coupled to surface acoustic wave element 11 via bump 17 and surface acoustic wave element 11 is insulated with sealing resin 21.

In the first exemplary embodiment, a $LiTaO_3$ single crystal is used as surface acoustic wave element 11, but other single crystals such as $LiNbO_3$, quartz, piezoelectric ceramics, or the like, can be selected.

On a principal surface (first surface) of surface acoustic wave element 11, electrodes for exciting a surface acoustic wave, for example, interdigital transducer (or comb-shaped electrode) 12a, pad electrode 12b, a wiring electrode (not shown), and the like, are formed. Materials of these electrodes are not particularly limited. However, it is desirable to use a light-weight Al-based material for interdigital transducer 12a. It is desirable to use a material containing Au on the outermost surface in order to enhance the coupling reliability with respect to solder materials. An electrode pattern to be formed on the principal surface of surface acoustic wave element 11 is not particularly limited and a well-known surface acoustic wave filter, a surface acoustic wave resonator, and the like, can be formed.

For mounting substrate 13, alumina is used, but insulating materials such as other ceramics, glass ceramics, a resin substrate, or the like, can be selected. Mounting substrate 13 is provided with pad electrode 14a on the front surface and pad electrode 14b on the rear surface thereof. Furthermore, inside the substrate, rewiring layer 15 is provided. Between pad electrode 14a and rewiring layer 15 or between pad electrode 14b and rewiring layer 15, via electrode 16a or 16b for coupling pad electrode 14a or 14b and rewiring layer 15 are formed. Note here that the rewiring layer is formed of a single electrode layer. However, a mounting substrate having two or more of electrode layers may be used if necessary.

As electrode materials used for mounting substrate 13, it is possible to select a conformable material such as tungsten (W), molybdenum (Mo), silver (Ag), copper (Cu), and the like, depending upon the kind of substrate materials. It is desirable that nickel/gold (Ni/Au) plating and the like is provided on the surfaces of pad electrodes 14a and 14b in order to enhance the coupling reliability with respect to a solder material. As to pad electrode 14a on the front surface, in order to reduce the diameter, Ni/Au plating etc. may be directly provided only on the upper surface of the via electrode.

Surface acoustic wave element 11 is disposed over the upper surface of mounting substrate 13 with a principal surface on which interdigital transducer 12a serving as an exciting portion facing downward. Pad electrodes 12b and 14a on both surface acoustic wave element 11 and mounting substrate 13 are fixed with bump 17 and also electrically coupled to each other.

As bump 17, a low-cost soldering bump is used. As the solder material, it is desirable to use lead-free solder from an environmental viewpoint. In the first exemplary embodiment, a solder material containing Sn—Ag—Cu as a component is used, but materials containing other components may be used. Furthermore, as the composing ratio thereof, appropriate ratio can be selected from a viewpoint of, for example, coupling reliability.

Between surface acoustic wave element 11 and mounting substrate 13, gap (vibration space) 20 in order not to inhibit excitation of a surface acoustic wave is formed. Sealing resin 21 carries out sealing so as to cover surface acoustic wave element 11 on mounting substrate 13. Herein, the distance of gap 20 is about 50 μm.

In the first exemplary embodiment, sealing resin 21 has a structure in which three layers consisting of first resin 21a, second resin 21b and third resin 21c are laminated. First resin 21a covers rear surface 11b and the side surfaces of surface acoustic wave element 11 and a part of the upper surface of mounting substrate 13. Second resin 21b covers first resin 21a, and third resin 21c covers second resin 21b. Herein, first resin 21a has a thickness of about 20 μm in the vicinity of rear surface 11b (for example, on line L1 shown in FIG. 2) and a thickness of about 15 μm in the vicinity of the side surface (for example, on line L2 shown in FIG. 2) of surface acoustic wave element 11 and has a volume elastic modulus after it is hardened (hereinafter, which is referred to as "elastic modulus") of about 2 GPa. Furthermore, second resin 21b has a thickness of about 60 μm in the vicinity of rear surface 11b (for example, on line L1 shown in FIG. 2) of surface acoustic wave device 11 and has an elastic modulus after it is hardened of about 18 GPa. Furthermore, an elastic modulus of third resin 21c after it is hardened is about 9 GPa.

Third resin 21c forms a rear surface and a part of side surfaces of surface acoustic wave device 100. Therefore, the elastic modulus and the linear expansion coefficient of third resin 21c largely affect reliability under temperature cycling and the like of surface acoustic wave device 100. When the elastic modulus and the linear expansion coefficient of third resin 21c are too high, since sealing resin 21 is largely deformed due to the change in temperature, surface acoustic wave device 100 may be bent and the inside or coupling portions of solder bump 17 may be cracked. Therefore, it is preferable that the elastic modulus of third resin 21c is lower than 10 GPa and it is 5 GPa or higher in order to maintain the strength of the surface of surface acoustic wave device 100. It is preferable that the linear expansion coefficient is less than 50 ppm/° C. and it is the same level as the linear expansion coefficient of surface acoustic wave element 11.

The elastic modulus of second resin 21b is higher than that of third resin 21c. Therefore, when a high pressure is applied to the surface acoustic wave device from the outside, second resin 21b receives the pressure, thus enabling a pressure applied to bump 17 to be reduced. Thereby, it is possible to prevent disorder due to the crushing of bump 17. Furthermore, it has an effect of preventing deformation of sealing resin 21 when the pressure inside surface acoustic wave device 100 is increased.

When surface acoustic wave device 100 is used as an electric component module, secondary molding such as transfer molding may be carried out. At this time, a high pressure such as 10 MPa (100 bar) is applied to surface acoustic wave device 100. In order to endure such a high pressure, the elastic modulus of second resin 21b is preferably higher than 10 GPa and more preferably 15 GPa or higher.

Furthermore, since the transfer molding is carried out at a high temperature, for example, 170° C. or higher, the glass-transition temperature (Tg) of second resin 21b is preferably higher than 100° C. and more preferably, 170° C. or higher.

The elastic modulus of first resin 21a that is brought into direct contact with surface acoustic wave element 11 is lower than that of third resin 21c. Stress generated by the change in temperature from the difference in expansion and contraction between sealing resin 21 and surface acoustic wave element 11 can be absorbed and reduced by first resin 21a. Thus, stress applied to the coupling portions of bump 17 can be remarkably reduced and reliability under temperature cycling and the like can be enhanced.

The elastic modulus of first resin 21a is preferably lower than 5 GPa and more preferably lower than 3 GPa in order to reduce stress applied to surface acoustic wave element 11 from sealing resin 21.

Materials of sealing resin 21 are not particularly limited, but epoxy resin is desirable because it contains less impurities. Furthermore, the elastic modulus and the linear expansion coefficient of resin 21 can be adjusted by properties or component ratio of materials such as filler to be mixed, particle diameter and mixing ratio of fillers, or the like. Note here that first resin 21a, second resin 21b and third resin 21c may be different resins, respectively. Alternatively, by using the same resin and respectively changing the kinds and mixing amount of the fillers to be filled, three layers of sealing resin 21 may be formed. In addition, sealing resin 21 can be formed of four layers or more.

Note here that an example of the method of forming three layers of sealing resin 21 includes various production methods. Firstly, a first resin composition including a thermosetting epoxy resin and filler is coated so as to cover surface acoustic wave element 11 and then hardened to form first resin 21a. Next, a second resin composition is coated so as to cover hardened first resin 21a and then hardened to form second resin 21b. Finally, a third resin composition is coated so as to cover hardened second resin 21b and then hardened to form third resin 21c.

Another method of manufacturing sealing resin 21 includes forming third resin layer 21c of a predetermined resin composition on one surface of a resin film as a second resin having an elastic modulus of 5 to 10 GPa and forming first resin layer 21a on another surface of the resin film. The thus formed laminated sheet can be attached to surface acoustic wave element 11 via first resin layer 21a while heating.

The thickness of first resin 21a formed on rear surface 11b of surface acoustic wave element 11 is preferably the same as the thickness of first resin 21a formed on the upper surface of mounting substrate 13. When first resin 21a on mounting substrate 13 is crushed because of its low elastic modulus under strong pressure applied from the outside, first resin 21a on the surface acoustic wave element 11 is crushed by the same thickness. Thereby, large stress is not applied to surface acoustic wave element 11, thus preventing bump 17 from being crushed.

When the thickness of first resin 21a formed on rear surface 11b of surface acoustic wave element 11 is thinner than the thickness of first resin 21a formed on the upper surface of mounting substrate 13, the above-mentioned effect is not obtained. On the contrary, when the thickness of first resin 21a that is brought into contact with rear surface 11b of surface acoustic wave element 11 is larger than the thickness of first resin 21a formed on the upper surface of mounting substrate 13, second resin 21b that is brought into contact with rear surface 11b of surface acoustic wave element 11 becomes thinner and the strength of sealing resin 21 of rear surface 11b of surface acoustic wave element 11 is deteriorated.

It is preferable that the thickness of first resin 21a formed on the side surface of surface acoustic wave element 11 is 1/10 to 1/2 of the height of gap (vibration space) 20 between surface acoustic wave element 11 and mounting substrate 13. When the thickness of first resin 21a is larger than 1/2 of the height of the vibration space, when the first resin is crushed by a strong pressure from the outside, a shearing stress applied to the side surface of surface acoustic wave element 11 is increased and thus stress applied to bump 17 is increased. On the contrary, when the thickness of first resin 21a is thinner than 1/10 of the height of the thickness of the vibration space, it is difficult to obtain an effect of reducing stress applied from sealing resin 21 to surface acoustic wave element 11.

Second Exemplary Embodiment

Hereinafter, the present invention is described with reference to a second exemplary embodiment. The same reference numerals are given to the same elements as those in the first exemplary embodiment and the description therefor is simplified.

The invention in accordance with the first exemplary embodiment is different from the invention in accordance with the second exemplary embodiment in that a sealing resin does not enter the space between a surface acoustic wave element and a mounting substrate in the invention of the first exemplary embodiment while a first resin and a second resin enter and intervenes in a part of the space between a surface acoustic wave element and a mounting substrate in the invention of the second exemplary embodiment.

Figure 2:
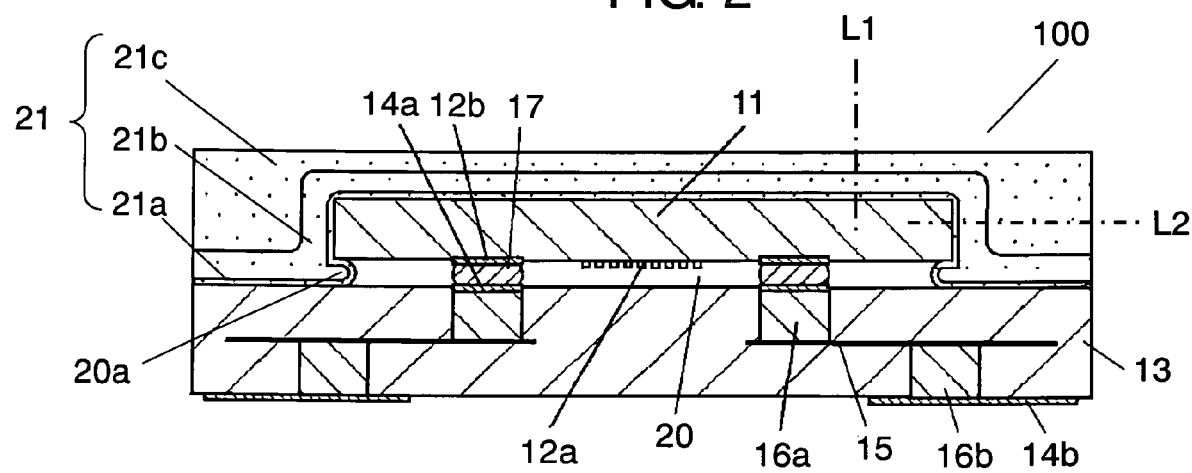
FIG. 2 is a sectional view showing a surface acoustic wave device in accordance with a second exemplary embodiment of the present invention.
Figure 3A:
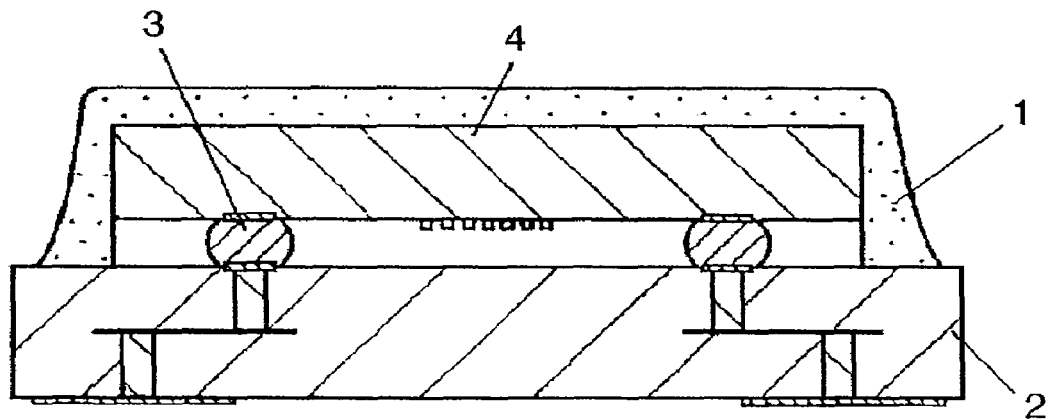
FIG. 3A is a sectional view showing a conventional surface acoustic wave device.
Figure 3B:
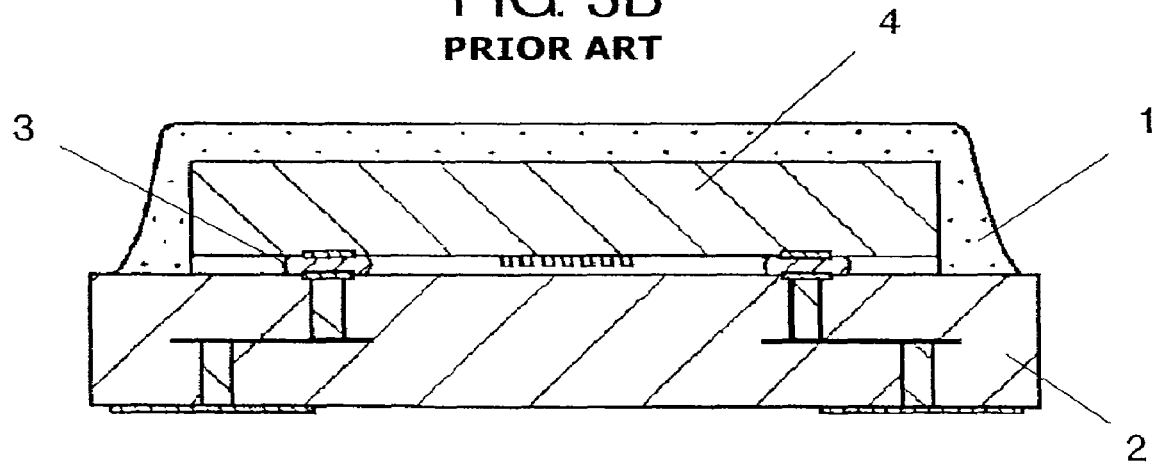
FIG. 3B is a sectional view showing a conventional surface acoustic wave device.

In FIG. 2, in outer peripheral portion 20a of gap (vibration space) 20 between surface acoustic wave element 11 and mounting substrate 13, second resin 21b having a high elastic modulus exists. Thus, even when a strong pressure is applied to the surface acoustic wave device from the outside, surface acoustic wave element 11 is prevented from falling and bump 17 is prevented from being crushed. Thus, a surface acoustic wave device having higher strength can be obtained.

The amount of second resin 21b to be allowed to exist in the space between surface acoustic wave element 11 and mounting substrate 13 can be determined within a range that may not inhibit the vibration of surface acoustic wave. Such a shape can be obtained by carrying out vacuum laminate with the use of a film-shaped resin as at least first resin 21a.

By allowing filler to be contained in a second resin existing in outer peripheral portion 20a of gap 20 between surface acoustic wave element 11 and mounting substrate 13, for example, even when the elastic modulus of a resin component is deteriorated due to high temperature, the strength of second resin 21b can be maintained and bump 17 can be prevented from being crushed.

The filler can be selected from inorganic materials, metal materials, and the like. Specifically, spherical silica having high strength and being excellent in dispersibility, fluidity, and the like is more preferable.

It is preferable that the filler contains filler having a particle diameter that is not smaller than 40% of the height of the space between surface acoustic wave element 11 and mounting substrate 13. With such a configuration, even when bump 17 is crushed by not smaller than an assumed pressure, the height of the space between surface acoustic wave element 11 and mounting substrate 13 can be reliably secured by at least 40% or more. In particular, problems of electric characteristics such as a short-circuit fault does not easily occur.

It is preferable that between second resin 21b and surface acoustic wave element 11, first resin 21a having a low elastic modulus is formed without fail. With such a configuration, second resin 21b having a high elastic modulus is not brought into direct contact with surface acoustic wave element 11. With such a configuration, when second resin 21b existing in outer peripheral portion 20a of gap 20 between surface acoustic wave element 11 and mounting substrate 13 expands and contracts due to the change in temperature and the like, stress applied to surface acoustic wave element 11 can be reduced. Therefore, stress applied to bump 17 having linear expansion coefficient that is different from that of the second resin can be reduced.

In the second exemplary embodiment, second resin 21b is brought into contact with mounting substrate 13 via first resin 21a. Furthermore, third resin 21c is brought into contact with mounting substrate 13 via first resin 21a or second resin 21c. Therefore, second resin 21b and third resin 21c are not brought into direct contact with mounting substrate 13. That is to say, second resin 21b and third resin 21c are only brought into contact with first resin 21a having a low elastic modulus, and they are brought into contact with neither surface acoustic wave element 11 nor mounting substrate 13. In other words, second resin 21b and third resin 21c are formed as if they were present independently from surface acoustic wave element 11 and mounting substrate 13. With such a configuration, stress applied from sealing resin 21 to mounting substrate 13 due to the change in temperature can be reduced by inclusion of first resin 21a having a low elastic modulus. That is to say, mounting substrate 13 can be prevented from bending due to the stress of sealing resin 21 and stress applied from mounting substrate 13 to bump 17 can be reduced. Thus, a surface acoustic wave device that is excellent in reliability under temperature cycling and the like can be obtained.

As described above, the surface acoustic wave device in accordance with the present invention has a three-layered structure of sealing resin in which the elastic modulus of resin of the intermediate layer is higher than that of resin of the outermost layer and the elastic modulus of resin of the innermost layer is lower than that of resin of the outermost layer. This configuration suppresses crushing of a bump when a strong pressure is applied from the outside, making it possible to avoid problems in electrical characteristics, for example, an open-circuit fault, a short-circuit fault, and the like, and providing a high reliability under temperature cycling and the like. Furthermore, since manufacturing is easy, a manufacturing cost can be reduced.

INDUSTRIAL APPLICABILITY

A surface acoustic wave device in accordance with the present invention is useful for electronic component modules to which a high pressure is applied at the time of manufacturing, communication devices using the electronic component modules, and the like.

Furthermore, in the surface acoustic wave device in accordance with the present invention, crushing of bumps when a strong pressure is applied from the outside is suppressed, and problems in electronic characteristics, for example, an open-circuit fault, a short-circuit fault, and the like, can be avoided. Therefore, the surface acoustic wave device in accordance with the present invention can be used for applications of electronic component modules that need a pressure resistance property, communication devices, and the like.

The invention claimed is:

1. A surface acoustic wave device comprising:
    a surface acoustic wave element having a first surface on which an electrode is formed;
    a mounting substrate having an electrode on a surface and disposed facing the first surface with a gap of a predetermined distance sandwiched therebetween;
    a bump for coupling the electrode on the surface acoustic wave element and the electrode on the mounting substrate to each other; and
    a sealing resin formed on the mounting substrate so as to cover the surface acoustic wave element;
    wherein the sealing resin comprises
    a first resin surrounding the surface acoustic wave element and covering the mounting substrate on a periphery of the surface acoustic wave element,
    a second resin covering at least the first resin, and
    a third resin covering at least the second resin,
    in which the third resin has an elastic modulus that is lower than an elastic modulus of the second resin and that is higher than an elastic modulus of the first resin,
    wherein a thickness of the first resin formed on a side surface of the surface acoustic wave element is $\frac{1}{10}$ to $\frac{1}{2}$ of the distance of the gap.

2. The surface acoustic wave device of claim 1, wherein at least the second resin in the sealing resin further intervenes in a part of the gap between the surface acoustic wave element and the mounting substrate.

3. The surface acoustic wave device of claim 2, wherein the second resin is a resin filled with filler.

4. The surface acoustic wave device of claim 3, wherein the filler comprises filler having a diameter that is 40% or more of the distance of the gap.

5. The surface acoustic wave device of claim 1, wherein the second resin and the third resin are not brought into direct contact with the mounting substrate.

6. The surface acoustic wave device of claim 1, wherein the second resin is brought into contact with the mounting substrate via the first resin and the third resin is brought into contact with the mounting substrate via the first resin or the second resin.

7. The surface acoustic wave device of claim 1, wherein the elastic modulus of the third resin is not lower than 5 GPa and not higher than 10 GPa.

8. A surface acoustic wave device comprising:
    a surface acoustic wave element and a mounting substrate, which are disposed in such a manner in which a surface of an excitation portion of the surface acoustic wave element faces an upper surface of the mounting substrate;
    a pad electrode on the surface acoustic wave element and a pad electrode on the mounting substrate both being fixed with a bump so that they are electrically coupled to each other; and
    an upper surface of the mounting substrate being sealed with sealing resin so as to cover the surface acoustic wave element in a state in which vibration space is secured between the excitation portion of the surface acoustic wave element and the mounting substrate;
    wherein the sealing resin has at least three-layered structure including,
    a first resin covering a rear surface and a side surface of the surface acoustic wave element and at least a part of the upper surface of the mounting substrate,
    a second resin covering at least the first resin, and
    a third resin covering at least the second resin
    in which the second resin has an elastic modulus that is higher than an elastic modulus of the third resin and the first resin has an elastic modulus that is lower than an elastic modulus of the third resin,
    wherein at least the second resin exists in a part of space between the surface acoustic wave element and the mounting substrate.

9. A surface acoustic wave device comprising:
    a surface acoustic wave element having a first surface on which an electrode is formed;
    a mounting substrate having an electrode on a surface and disposed facing the first surface with a gap of a predetermined distance sandwiched therebetween;
    a bump for coupling the electrode on the surface acoustic wave element and the electrode on the mounting substrate to each other; and
    a sealing resin formed on the mounting substrate so as to cover the surface acoustic wave element;
    wherein the sealing resin comprises
    a first resin surrounding the surface acoustic wave element and covering the mounting substrate on a periphery of the surface acoustic wave element,
    a second resin covering at least the first resin, and
    a third resin covering at least the second resin,
    in which the third resin has an elastic modulus that is lower than an elastic modulus of the second resin and that is higher than an elastic modulus of the first resin,
    wherein at least the second resin in the sealing resin further intervenes in a part of the gap between the surface acoustic wave element and the mounting substrate.

10. The surface acoustic wave device of claim 9, wherein the second resin is a resin filled with filler.

11. The surface acoustic wave device of claim 10, wherein the filler comprises filler having a diameter that is 40% or more of the distance of the gap.

12. The surface acoustic wave device of claim 9, wherein the second resin and the third resin are not brought into direct contact with the mounting substrate.

13. The surface acoustic wave device of claim 9, wherein the second resin is brought into contact with the mounting substrate via the first resin and the third resin is brought into contact with the mounting substrate via the first resin or the second resin.

14. A surface acoustic wave device comprising:
    a surface acoustic wave element having a first surface on which an electrode is formed;
    a mounting substrate having an electrode on a surface and disposed facing the first surface with a gap of a predetermined distance sandwiched therebetween;
    a bump for coupling the electrode on the surface acoustic wave element and the electrode on the mounting substrate to each other; and
    a sealing resin formed on the mounting substrate so as to cover the surface acoustic wave element;
    wherein the sealing resin comprises
    a first resin surrounding the surface acoustic wave element and covering the mounting substrate on a periphery of the surface acoustic wave element,
    a second resin covering at least the first resin, and
    a third resin covering at least the second resin,
    in which the third resin has an elastic modulus that is lower than an elastic modulus of the second resin and that is higher than an elastic modulus of the first resin,
    wherein the second resin and the third resin are not brought into direct contact with the mounting substrate.

15. The surface acoustic wave device of claim 14,
wherein the second resin is brought into contact with the mounting substrate via the first resin and the third resin is brought into contact with the mounting substrate via the first resin or the second resin.

16. A surface acoustic wave device comprising:
a surface acoustic wave element having a first surface on which an electrode is formed;
a mounting substrate having an electrode on a surface and disposed facing the first surface with a gap of a predetermined distance sandwiched therebetween;
a bump for coupling the electrode on the surface acoustic wave element and the electrode on the mounting substrate to each other; and
a sealing resin formed on the mounting substrate so as to cover the surface acoustic wave element;
wherein the sealing resin comprises
  a first resin surrounding the surface acoustic wave element and covering the mounting substrate on a periphery of the surface acoustic wave element,
  a second resin covering at least the first resin, and
  a third resin covering at least the second resin,
in which the third resin has an elastic modulus that is lower than an elastic modulus of the second resin and that is higher than an elastic modulus of the first resin,
wherein the second resin is brought into contact with the mounting substrate via the first resin and the third resin is brought into contact with the mounting substrate via the first resin or the second resin.

* * * * *